(12) United States Patent
Murao

(10) Patent No.: US 10,096,882 B2
(45) Date of Patent: Oct. 9, 2018

(54) DUPLEXER

(71) Applicant: NEC Corporation, Tokyo (JP)

(72) Inventor: Yoji Murao, Tokyo (JP)

(73) Assignee: NEC Corporation, Tokyo (JP)

( * ) Notice: Subject to any disclaimer, the term of this patent is extended or adjusted under 35 U.S.C. 154(b) by 1 day.

(21) Appl. No.: 14/776,054

(22) PCT Filed: Feb. 28, 2014

(86) PCT No.: PCT/JP2014/055003
§ 371 (c)(1),
(2) Date: Sep. 14, 2015

(87) PCT Pub. No.: WO2014/141897
PCT Pub. Date: Sep. 18, 2014

(65) Prior Publication Data
US 2016/0028143 A1    Jan. 28, 2016

(30) Foreign Application Priority Data
Mar. 15, 2013 (JP) .................. 2013-053206

(51) Int. Cl.
*H03B 1/00* (2006.01)
*H01P 5/12* (2006.01)
(Continued)

(52) U.S. Cl.
CPC .................. *H01P 5/12* (2013.01); *H01P 1/20* (2013.01); *H01P 1/213* (2013.01); *H01P 1/36* (2013.01);
(Continued)

(58) Field of Classification Search
CPC ...... H03H 9/725; H03H 9/0576; H03H 9/706; H03H 9/6483
See application file for complete search history.

(56) References Cited

U.S. PATENT DOCUMENTS 7,719,384 B1 * 5/2010 Arceo ..................... H01P 1/213
333/1.1
2005/0008369 A1    1/2005 Winzer

FOREIGN PATENT DOCUMENTS

EP    1 860 732 A1    11/2007
JP    48-61047    8/1973
(Continued)

OTHER PUBLICATIONS

International Search Report and Written Opinion dated May 13, 2014 in corresponding PCT International Application.
(Continued)

*Primary Examiner* — Sibin Chen
(74) *Attorney, Agent, or Firm* — Finnegan, Henderson, Farabow, Garrett & Dunner, L.L.P.

(57) ABSTRACT

A duplexer according to the present invention includes a transmission-side terminal, a reception-side terminal, a common terminal, a transmission-side circuit unit, and a reception-side circuit unit. Here, the transmission-side circuit unit is connected between the transmission-side terminal and the common terminal. The reception-side circuit unit is connected between the common terminal and the reception-side terminal. The transmission-side circuit unit includes a first transmission-side filter, a second transmission-side filter, and a transmission-side directional propagation circuit. Here, the first transmission-side filter is provided in the subsequent stage of the transmission-side terminal. The second transmission-side filter is provided in a stage subsequent to the first transmission-side filter. The transmission-side directional propagation circuit is connected between the first transmission-side filter and the second transmission-side filter. The reception-side circuit unit includes a first reception-side filter, a second reception-side filter, and a reception-side directional propagation circuit. Here, the first reception-side filter is provided in the subsequent stage of the common terminal. The second reception-side filter is
(Continued)

provided in a stage subsequent to the first reception-side filter. The reception-side directional propagation circuit is connected between the first reception-side filter and the second reception-side filter.

5 Claims, 2 Drawing Sheets

(51) Int. Cl.
    *H01P 1/213*     (2006.01)
    *H01P 1/20*     (2006.01)
    *H01P 1/36*     (2006.01)
    *H01P 1/38*     (2006.01)
    *H03F 3/19*     (2006.01)
    *H03F 3/60*     (2006.01)
    *H04B 1/50*     (2006.01)

(52) U.S. Cl.
    CPC ................ *H01P 1/38* (2013.01); *H03F 3/19* (2013.01); *H03F 3/60* (2013.01); *H04B 1/50* (2013.01)

(56) References Cited

FOREIGN PATENT DOCUMENTS

| JP | 60-158711 | 8/1985 |
|---|---|---|
| JP | 63-59125 | 3/1988 |
| JP | 2-22931 | 1/1990 |
| JP | 7-30304 | 1/1995 |
| JP | 11-145577 | 5/1999 |
| JP | 2003-124706 | 4/2003 |
| JP | 2003-258675 | 9/2003 |
| JP | 2004-312550 | 11/2004 |
| JP | 2005-45789 | 2/2005 |
| JP | 2013-46162 | 3/2013 |

OTHER PUBLICATIONS

Japanese Office Action dated Apr. 12, 2016, by the Japanese Patent Office in counterpart Japanese Patent Application No. 2015-505388.

Extended European Search Report dated Oct. 21, 2016, by the European Patent Office in counterpart European Patent Application No. 14763862.1.

International Search Report and Written Opinion dated Apr. 28, 2014 in corresponding PCT International Application.

Japanese Office Action dated Aug. 16, 2016, by the Japanese Patent Office in counterpart Japanese Patent Application No. 2015-505388.

Notice of Allowance dated Nov. 22, 2016, by the Japanese Patent Office in counterpart Japanese Patent Application No. JP 2015-505388.

\* cited by examiner

DUPLEXER

CROSS-REFERENCE TO RELATED PATENT APPLICATIONS

This application is a National Stage Entry of International Application No. PCT/JP2014/055003, filed Feb. 28, 2014, which claims priority from Japanese Patent Application No. 2013-053206, filed Mar. 15, 2013. The entire contents of the above-referenced applications are expressly incorporated herein by reference.

TECHNICAL FIELD

The present invention relates to a duplexer, and particularly the present invention can be suitably used to a diplexer including a filter.

BACKGROUND ART

FIG. 1 is a circuit diagram showing the structure of a duplexer in the related art. It is common practice to provide a duplexer having the structure shown in FIG. 1 in a radio front-end unit of a mobile phone base station. The structure of the duplexer in the related art shown in FIG. 1 will be described.

Components of the duplexer shown in FIG. 1 will be described. The duplexer shown in FIG. 1 includes a transmission signal input terminal 110, an antenna terminal 120, a received signal output terminal 130, a transmission-band filter 140, and a reception-band filter 160.

A connection relationship between components of the duplexer shown in FIG. 1 will be described. The transmission signal input terminal 110 is connected to one terminal of the transmission-band filter 140. The antenna terminal 120 is connected to the other terminal of the transmission-band filter 140 and one terminal of the reception-band filter 160. The other terminal of the reception-band filter 160 is connected to the received signal output terminal 130.

It is known that the duplexer in the related art having the structure shown in FIG. 1 has a problem of being difficult to downsize. In other words, when the duplexer in the related art is downsized, distance between the transmission signal input terminal 110 and the antenna terminal 120, and the received signal output terminal 130 becomes short and spatial interference becomes great. As a result, a problem of the shortage of out-of-band attenuation amounts in both the transmission-band filter 140 and the reception-band filter 160 is known.

Concerning the above, Patent Literature (PTL) 1 (Japanese Patent Application Laid-Open No. 2003-124706) discloses a description related to a bandpass filter. This bandpass filter is a two-port circuit, which is at least logically bilaterally symmetric with respect to a symmetry plane dividing the right and left sides and which has one input/output port on each of the right and left sides, respectively. This bandpass filter has an upper-left circuit A1, an upper-right circuit A2, and a lower circuit B0. The upper-left circuit A1 has a port 1 located on the left side, a capacitance Ca with one end grounded, and a line A connecting this capacitance Ca and the port 1. The upper-right circuit A2 has a port 1' located on the right side, a capacitance Ca with one end grounded, and a line A' connecting this capacitance Ca and the port 1'. The lower circuit B0 has a ground circuit B1 located on the left side, a ground circuit B2 located on the right side, a ground circuit B3 located at the center, a line B connecting the ground circuit B1 and the ground circuit B3, and a line B' connecting the ground circuit B2 and the ground circuit B3. The line A and the line B are so wired that at least parts thereof will be substantially parallel with each other to form a coupled line.

In other words, the bandpass filter described in PTL 1 is made up by forming filters at multiple stages with an amplifier placed between stages.

CITATION LIST

Patent Literature

[PTL 1] Japanese Patent Application Laid-Open No. 2003-124706

SUMMARY OF INVENTION

Technical Problem

It is an object of the present invention to provide a duplexer capable of securing a sufficient out-of-band attenuation amount even when the duplexer is downsized.

Solution to Problem

A duplexer according to the present invention includes a transmission-side terminal, a reception-side terminal, a common terminal, a transmission-side circuit unit, and a reception-side circuit unit. Here, the transmission-side terminal is to input a transmission signal. The reception-side terminal is to output a received signal. The common terminal is to input the transmission signal from the transmission-side terminal and output the received signal to the reception-side terminal. The transmission-side circuit unit is connected between the transmission-side terminal and the common terminal. The reception-side circuit unit is connected between the common terminal and the reception terminal. The transmission-side circuit unit includes a first transmission-side filter, a second transmission-side filter, and a transmission-side directional propagation circuit. Here, the first transmission-side filter is provided in the subsequent stage of the transmission-side terminal to allow passage of a predetermined transmission-band component in the transmission signal. The second transmission-side filter is provided in a stage subsequent to the first transmission-side filter to allow passage of the transmission band component in the transmission signal. The transmission-side directional propagation circuit is connected between the first transmission-side filter and the second transmission-side filter to propagate, in a specific direction, a signal input from one terminal and output the signal from the other terminal. The reception-side circuit unit includes a first reception-side filter, a second reception-side filter, and a reception-side directional propagation circuit. Here, the first reception-side filter is provided in the subsequent stage of the common terminal to allow passage of a predetermined reception-band component in the received signal. The second reception-side filter is provided in a stage subsequent to the first reception-side filter to allow passage of the reception band component in the received signal. The reception-side directional propagation circuit is connected between the first reception-side filter and the second reception-side filter to propagate, in a specific direction, a signal input from one terminal and output the signal from the other terminal.

Advantageous Effects of Invention

The duplexer is required to achieve out-of-transmission-band attenuation on the transmission side and out-of-reception-band attenuation on the reception side. Like in the present invention, filters are arranged in a multistage structure on both the transmission side and the reception side so that the amount of attenuation required for a filter per stage can be reduced. Spatial distance can also be kept by separating a filter into two or more parts, and this can suppress deterioration in attenuation amount due to spatial interference. Further, compared to a case where the filters are connected directly, the effect of suppressing a ripple between stages can be obtained by providing a directional propagation circuit, such as an isolator or a circulator, between filter stages.

DESCRIPTION OF EMBODIMENTS

Modes for carrying out a duplexer according to the present invention will be described below with reference to the accompanying drawings.

First Embodiment

Figure 1:
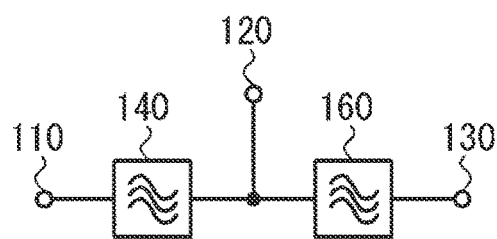
FIG. 1 is a circuit diagram showing the structure of a duplexer in the related art.
Figure 2:
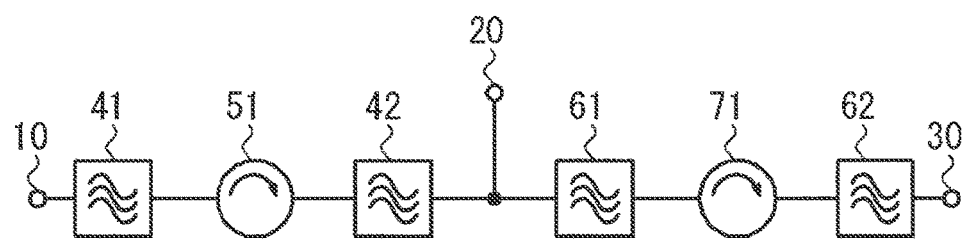
FIG. 2 is a circuit diagram showing an example of the structure of a duplexer according to a first embodiment of the present invention.

FIG. 2 is a circuit diagram showing an example of the structure of a duplexer according to a first embodiment of the present invention. Components of the duplexer shown in FIG. 2 will be described.

The duplexer shown in FIG. 2 includes a transmission signal input terminal 10, a transmission-band first filter 41 as a first transmission-side filter, a transmission-band isolator 51, a transmission-band second filter 42 as a second transmission-side filter, an antenna terminal 20 as a common terminal, a reception-band first filter 61 as a first reception-side filter, a reception-band isolator 71, a reception-band second filter 62 as a second reception-side filter, and a received signal output terminal 30.

Here, for example, a small dielectric filter or the like may be used to construct each of the transmission-band first filter 41, the transmission-band second filter 42, the reception-band first filter 61, and the reception-band second filter 62, respectively.

Further, for example, a circulator or the like with one of three terminals terminated may be used to construct each of the transmission-band isolator 51 and the reception-band isolator 71, respectively.

Each of the transmission-band first filter 41, the transmission-band isolator 51, the transmission-band second filter 42, the reception-band first filter 61, the reception-band isolator 71, and the reception-band second filter 62 shown in FIG. 2 has a first terminal and a second terminal, respectively.

A connection relationship between components of the duplexer shown in FIG. 2 will be described. The transmission signal input terminal 10, the transmission-band first filter 41 as the first transmission-side filter, the transmission-band isolator 51, the transmission-band second filter 42 as the second transmission-side filter, the antenna terminal 20 as the common terminal, the reception-band first filter 61 as the first reception-side filter, the reception-band isolator 71, the reception-band second filter 62 as the second reception-side filter, and the received signal output terminal 30 are connected in series in this order.

In other words, the transmission signal input terminal 10 is connected to the first terminal of the transmission-band first filter 41. The second terminal of the transmission-band first filter 41 is connected to the first terminal of the transmission-band isolator 51. The second terminal of the transmission-band isolator 51 is connected to the first terminal of the transmission-band second filter 42. The second terminal of the transmission-band second filter 42 is connected in common to the antenna terminal 20 and the first terminal of the reception-band first filter 61. The second terminal of the reception-band first filter 61 is connected to the first terminal of the reception-band isolator 71. The second terminal of the reception-band isolator 71 is connected to the first terminal of the reception-band second filter 62. The second terminal of the reception-band second filter 62 is connected to the received signal output terminal 30.

In other words, the transmission-band first filter 41 is connected to the subsequent stage of the transmission signal input terminal 10 and the preceding stage of the transmission-band isolator 51. The transmission-band isolator 51 is connected to the subsequent stage of the transmission-band first filter 41 and the preceding stage of the transmission-band second filter 42. The transmission-band second filter 42 is connected to the subsequent stage of the transmission-band isolator 51 and a stage previous to the reception-band first filter 61. The antenna terminal 20 is connected to the subsequent stage of the transmission-band second filter 42 and the preceding stage of the reception-band first filter 61. The reception-band first filter 61 is connected to a stage subsequent to the transmission-band second filter 42 and the preceding stage of the reception-band isolator 71. The reception-band isolator 71 is connected to the subsequent stage of the reception-band first filter 61 and the preceding stage of the reception-band second filter 62. The reception-band second filter 62 is connected to the subsequent stage of the reception-band isolator 71 and the preceding stage of the received signal output terminal 30. The received signal output terminal 30 is connected to the subsequent stage of the reception-band second filter 62.

In the example of the structure of the duplexer according to the first embodiment of the present invention shown in FIG. 2, filters are formed in a two-stage structure with one isolator provided between the stages. However, the number of these filters is just an example and does not limit the present invention. In other words, for example, the number of filter stages may be three or more, and isolators may be provided between respective stages.

The operation of the duplexer shown in FIG. 2 will be described. First, the transmission-band isolator 51 outputs, from the second terminal on the side of the antenna terminal 20, a signal input from the first terminal on the side of the transmission signal input terminal 10 while blocking a signal from the second terminal to the first terminal. Similarly, the reception-band isolator 71 outputs, from the second terminal on the side of the received signal output terminal 30, a signal input from the first terminal on the side of the antenna terminal 20 while blocking a signal from the second terminal to the first terminal.

Next, each of the transmission-band first filter 41 and the transmission-band second filter 42 outputs, from the second terminal on the side of the antenna terminal 20, a frequency component contained in a predetermined transmission band of a signal input from the first terminal on the side of the transmission signal input terminal 10, and attenuates, suppresses, or blocks any other frequency component, respectively. Similarly, each of the reception-band first filter 61 and the reception-band second filter 62 outputs, from the second terminal on the side of the received signal output terminal 30, a frequency component contained in a predetermined reception band of a signal input from the first terminal on the side of the antenna terminal 20, and attenuates, suppresses, or blocks any other frequency component, respectively.

Here, an assembly of the transmission-band first filter 41, the transmission-band isolator 51, and the transmission-band second filter 42 provided between the transmission signal input terminal 10 and the antenna terminal 20 is called a transmission-side circuit unit. The transmission-side circuit unit outputs, from the antenna terminal 20, only a frequency component contained in a predetermined transmission band of a transmission signal input from the transmission signal input terminal 10. At this time, a signal input from the antenna terminal 20 does not flow back to the transmission-side circuit unit and hence is not output from the transmission signal input terminal 10.

In other words, the transmission signal input from the transmission signal input terminal 10 passes through the transmission-band first filter 41, passes through the transmission-band isolator 51, passes through the transmission-band second filter 42, and is output from the antenna terminal 20. At this time, since a signal input from the antenna terminal 20 is blocked by the transmission-band isolator 51, the signal is not output from the transmission signal input terminal 10.

Similarly, an assembly of the reception-band first filter 61, the reception-band isolator 71, and the reception-band second filter 62 provided between the antenna terminal 20 and the received signal output terminal 30 is called a reception-side circuit unit. The reception-side circuit unit outputs, from the received signal output terminal 30, only a frequency component contained in a predetermined reception band of a received signal input from the antenna terminal 20. At this time, a signal input from the received signal output terminal 30 does not flow back to the reception-side circuit unit and hence is not output from the antenna terminal 20.

In other words, the received signal input from the antenna terminal 20 passes through the reception-band first filter 61, passes through the reception-band isolator 71, passes through the reception-band second filter 62, and is output from the received signal output terminal 30. At this time, since a signal input from the received signal output terminal 30 is blocked by the reception-band isolator 71, the signal is not output from the antenna terminal 20.

Working effects obtained by the duplexer shown in FIG. 2 will be described. First, the function as a filter in the transmission circuit unit is required to attenuate an out-of-transmission-band component. Here, in the structure example shown in FIG. 2, multiple filters are arranged in a multistage structure to reduce the amount of attenuation required for a filter per stage. This also holds true for the reception circuit unit.

Further, an isolator is placed between filter stages, and this is expected to have an effect of suppressing a ripple between stages compared to a case where the filters are connected directly in series.

Second Embodiment

Figure 3:
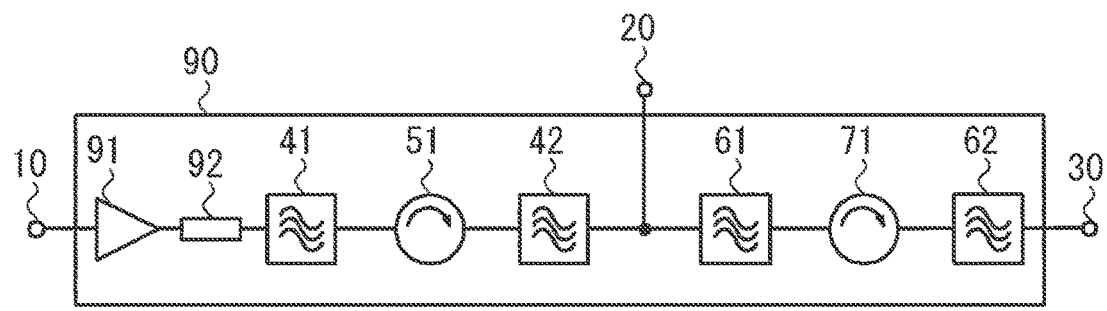
FIG. 3 is a circuit diagram showing an example of the structure of a duplexer according to a second embodiment of the present invention.

FIG. 3 is a circuit diagram showing an example of the structure of a duplexer according to a second embodiment of the present invention. The structure of the duplexer shown in FIG. 3 will be described.

The duplexer according to the second embodiment of the present invention shown in FIG. 3 is equivalent to that obtained by making the following changes to the duplexer according to the first embodiment of the present invention shown in FIG. 2. In other words, the duplexer shown in FIG. 3 is equivalent to that obtained by adding a printed circuit board 90, a high frequency amplifier 91, and a transmission line 92 to the duplexer shown in FIG. 2. Here, the high frequency amplifier 91 has an input terminal and an output terminal. The transmission line 92 has two terminals.

Since the other components of the duplexer shown in FIG. 3 are the same as those in the first embodiment shown in FIG. 2, further detailed description will be omitted.

Here, the high frequency amplifier 91 is generally made up of a group of electronic components mounted on the printed circuit board 90. It is preferred that the transmission-side circuit unit and the reception-side circuit unit of the duplexer be also mounted on the printed circuit board 90. It is also preferred that the transmission line 92 be formed as part of the printed circuit board 90, for example, as a microstrip line or the like.

A connection relationship between components of the duplexer shown in FIG. 3 will be described. The transmission signal input terminal 10 is connected to the input terminal of the high frequency amplifier 91. The output terminal of the high frequency amplifier 91 is connected to one terminal of the transmission line 92. The other terminal of the transmission line 92 is connected to the first terminal of the transmission-band first filter 41.

Since the connection relationship between the other components of the duplexer shown in FIG. 3 is the same as that in the first embodiment shown in FIG. 2, further detailed description will be omitted.

The duplexer is generally placed in the output stage of a transmission amplifier. Therefore, in the embodiment, a structure is proposed in which the high frequency amplifier 91 as the transmission amplifier and the duplexer are mounted on the same printed circuit board 90.

Further, another transmission line, not shown, and a low-noise reception amplifier, not shown, may be mounted on the printed circuit board 90 in the output stage of the duplexer.

Third Embodiment

Figure 4:
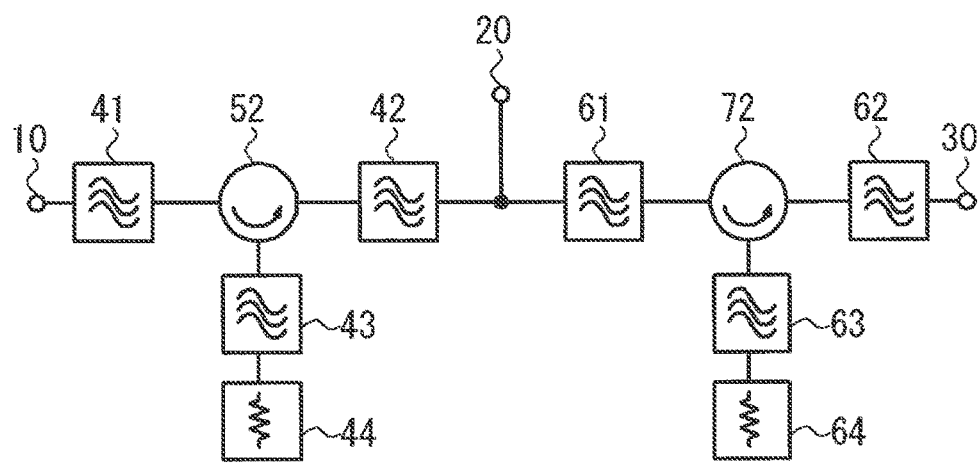
FIG. 4 is a circuit diagram showing an example of the structure of a duplexer according to a third embodiment of the present invention.

FIG. 4 is a circuit diagram showing an example of the structure of a duplexer according to a third embodiment of the present invention. The structure of the duplexer shown in FIG. 4 will be described.

The duplexer according to the third embodiment of the present invention shown in FIG. 4 is equivalent to that obtained by making the following changes to the duplexer according to the first embodiment of the present invention shown in FIG. 2. First, the transmission-band isolator 51 in the duplexer shown in FIG. 2 is replaced by an assembly of a transmission-band circulator 52 as a transmission-side directional propagation circuit, an out-of-transmission-band filter 43, and a first high frequency terminator 44. Further, the reception-band isolator 71 in the duplexer shown in FIG. 2 is replaced by an assembly of a reception-band circulator 72 as a reception-side directional propagation circuit, an out-of-reception-band filter 63, and a second high frequency terminator 64.

Here, each of the transmission-band circulator 52 and the reception-band circulator 72 has a first terminal, a second terminal, and a third terminal, respectively. Each of the out-of-transmission-band filter 43 and the out-of-reception-band filter 63 has a first terminal and a second terminal, respectively. Each of the first high frequency terminator 44 and the second high frequency terminator 64 has an input terminal, respectively.

Since the other components of the duplexer shown in FIG. 4 are the same as those in the first embodiment shown in FIG. 2, further detailed description will be omitted.

A connection relationship between components of the duplexer shown in FIG. 4 will be described. The first terminal of the transmission-band circulator 52 is connected to the second terminal of the transmission-band first filter 41. The second terminal of the transmission-band circulator 52 is connected to the first terminal of the transmission-band second filter 42. The third terminal of the transmission-band circulator 52 is connected to the first terminal of the out-of-transmission-band filter 43. The second terminal of the out-of-transmission-band filter 43 is connected to the input terminal of the first high frequency terminator 44. The first terminal of the reception-band circulator 72 is connected to the second terminal of the reception-band first filter 61. The second terminal of the reception-band circulator 72 is connected to the first terminal of the reception-band second filter 62. The third terminal of the reception-band circulator 72 is connected to the first terminal of the out-of-reception-band filter 63. The second terminal of the out-of-reception-band filter 63 is connected to the input terminal of the second high frequency terminator 64.

Since the connection relationship between the other components of the duplexer shown in FIG. 4 is the same as in the first embodiment shown in FIG. 2, further detailed description will be omitted.

The operation of the duplexer shown in FIG. 4 will be described. First, each of the transmission-band circulator 52 and the reception-band circulator 72 propagates a signal input from each of the three terminals internally in a specific direction to output the signal, respectively. In the example shown in FIG. 4, a signal input from the first terminal is output from the third terminal, a signal input from the second terminal is output from the first terminal, and a signal input from the third terminal is output from the second terminal.

More specifically, in the case of the transmission-band circulator 52, a signal input from the first terminal on the side of the transmission signal input terminal 10 is propagated toward the third terminal on the side of the first high frequency terminator 44. Here, only an out-of-transmission-band component in the signal input from the first terminal can pass through the out-of-transmission-band filter 43, and is then terminated by the first high frequency terminator 44. Any other component in the signal input from the first terminal, i.e., the transmission-band component cannot pass through the out-of-transmission-band filter 43 connected to the third terminal, continues to be propagated inside the transmission-band circulator 52, and is output from the second terminal on the side of the antenna terminal 20 like in the case of the signal input from the third terminal.

In other words, an assembly of the out-of-transmission-band filter 43 and the first high frequency terminator 44 connected to the third terminal of the transmission signal circulator 52 in FIG. 4 acts as a rejection filter.

Similarly, in the case of the reception-band circulator 72, a signal input from the first terminal on the side of the antenna terminal 20 is propagated toward the third terminal on the side of the second high frequency terminator 64. Here, only an out-of-reception-band component in the signal input from the first terminal can pass through the out-of-reception-band filter 63, and is then terminated by the second high frequency terminator 64. Any other component in the signal input from the first terminal, i.e., the reception-band component cannot pass through the out-of-reception-band filter 63 connected to the third terminal, continues to be propagated inside the reception-band circulator 72, and is output from the second terminal on the side of the received signal output terminal 30 like in the case of the signal input from the third terminal.

In other words, an assembly of the out-of-reception-band filter 63 and the second high frequency terminator 64 connected to the third terminal of the received signal circulator 72 in FIG. 4 also acts as a rejection filter.

Since the other operation of the duplexer according to the third embodiment of the present invention shown in FIG. 4 is the same as in the first embodiment of the present invention shown in FIG. 2, further detailed description will be omitted.

Fourth Embodiment

Figure 5:
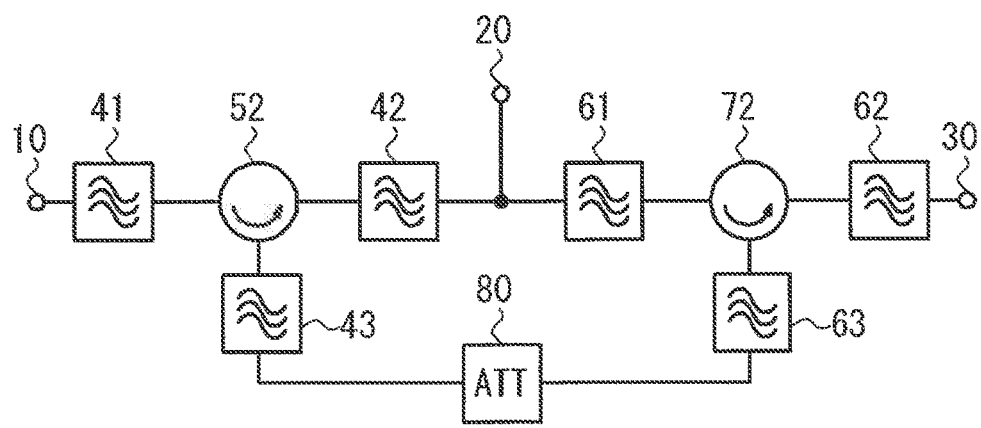
FIG. 5 is a circuit diagram showing an example of the structure of a duplexer according to a fourth embodiment of the present invention.

FIG. 5 is a circuit diagram showing an example of the structure of a duplexer according to a fourth embodiment of the present invention. The structure of the duplexer shown in FIG. 5 will be described.

The duplexer according to the fourth embodiment of the present invention shown in FIG. 5 is equivalent to that obtained by making the following changes to the duplexer according to the third embodiment of the present invention shown in FIG. 4. In other words, the duplexer shown in FIG. 5 replaces, by a high frequency attenuator 80, the first high frequency terminator 44 and the second high frequency terminator 64 in the duplexer shown in FIG. 4.

Here, the high frequency attenuator 80 has a first terminal and a second terminal.

Since the other components of the duplexer shown in FIG. 5 are the same as in the third embodiment shown in FIG. 4, further detailed description will be omitted.

A connection relationship between components of the duplexer shown in FIG. 5 will be described. The first terminal of the high frequency attenuator 80 is connected to the second terminal of the out-of-transmission-band filter 43. The second terminal of the high frequency attenuator 80 is connected to the second terminal of the out-of-reception-band filter 63.

Since the connection relationship between the other components of the duplexer shown in FIG. 5 is the same as in the third embodiment of the present invention shown in FIG. 4, further detailed description will be omitted.

The high frequency attenuator 80 attenuates a signal input from the first terminal and outputs the signal from the second terminal, and further attenuates a signal input from the second terminal and outputs the signal from the first terminal. More specifically, the high frequency attenuator 80 attenuates a signal output from the second terminal of the out-of-transmission-band filter 43 adequately, and outputs the signal toward the second terminal of the out-of-reception-band filter 63. Further, the high frequency attenuator 80 attenuates a signal output from the second terminal of the out-of-reception-band filter 63 adequately, and outputs the signal toward the second terminal of the out-of-transmission-band filter 43.

As the amount of attenuation of the high frequency attenuator 80 according to the fourth embodiment of the present invention, for example, about 10 dB (decibel) or more will be enough. However, this numerical value is just an example and does not limit the present invention. As another example, when isolation is required between the transmission circuit unit and the reception circuit unit of the duplexer, the amount of attenuation may be set to about 30 dB or more.

In the fourth embodiment of the present invention shown in FIG. 5, as compared to the third embodiment shown in FIG. 4, the first high frequency terminator 44 and the second high frequency terminator 64 are replaced by one high frequency attenuator 80. This contributes to reducing the number of parts in the duplexer and downsizing the duplexer.

While the invention made by the inventor has been specifically described based on the embodiments, the present invention is not limited to the embodiments. It goes without saying that various changes can be made without departing from the scope of the invention. Further, respective features described in the embodiments can be freely combined in a range not technically contradictory. For example, the second and third embodiments may be combined to mount, on the printed circuit board, the high frequency amplifier, the transmission-side circuit unit, the first high frequency terminator, the reception-side circuit unit, and the second high frequency terminator. Similarly, the second and fourth embodiments may be combined to mount, on the printed circuit board, the high frequency amplifier, the transmission-side circuit unit, the reception-side circuit unit, and the high frequency attenuator.

While the present invention has been described with reference to the embodiments, the present invention is not limited to the aforementioned embodiments. Various changes that can be understood by those skilled in the art within the scope of the present invention can be made to the configurations and details of the present invention.

This application is based upon Japanese patent application No. 2013-053206 as the basic application of this application, the contents of which are incorporated herein by reference.

REFERENCE SIGNS LIST 10 signal input terminal
20 antenna terminal
30 received signal output terminal
41 transmission-band first filter
42 transmission-band second filter
43 out-of-transmission-band filter
44 high frequency terminator
51 transmission-band isolator
61 reception-band first filter
62 reception-band second filter
63 out-of-reception-band filter
64 high frequency terminator
71 reception-band isolator
80 high frequency attenuator
91 high frequency amplifier
92 transmission line

The invention claimed is:

1. A duplexer comprising:
a transmission-side terminal for inputting a transmission signal;
a reception-side terminal for outputting a received signal;
a common terminal for inputting the transmission signal from the transmission-side terminal and outputting the received signal to the reception-side terminal;
a transmission-side circuit unit connected between the transmission-side terminal and the common terminal; and
a reception-side circuit unit connected between the common terminal and the reception-side terminal;
wherein:
the transmission-side circuit unit includes:
   a first transmission-side filter provided in a subsequent stage of the transmission-side terminal to allow passage of a predetermined transmission-band component in the transmission signal;
   a second transmission-side filter provided in a stage subsequent to the first transmission-side filter to allow passage of the transmission-band component in the transmission signal; and
   a transmission-side directional propagation circuit connected between the first transmission-side filter and the second transmission-side filter to propagate, in a specific direction, a signal input from one transmission-side terminal and output the signal from the other transmission-side terminal, and
the reception-side circuit unit includes:
   a first reception-side filter provided in a subsequent stage of the common terminal to allow passage of a predetermined reception-band component in the received signal;
   a second reception-side filter provided in a stage subsequent to the first reception-side filter to allow passage of the reception-band component in the received signal; and
   a reception-side directional propagation circuit connected between the first reception-side filter and the second reception-side filter to propagate, in a specific direction, a signal input from one reception-side terminal and output the signal from the other reception-side terminal;
wherein:
the transmission-side directional propagation circuit includes:
   a transmission-band circulator; and
   an out-of-transmission-band filter for blocking the transmission-band component in the transmission signal, the transmission-side circulator including:
      a transmission-side first terminal for inputting the transmission signal from the first transmission-side filter and propagating the transmission signal to a transmission-side third terminal;
      a transmission-side second terminal for outputting, to the second transmission-side filter, the transmission-band component in the transmission signal; and
      a transmission-side third terminal for outputting, to one terminal of the out-of-transmission-band filter, a component other than that of the transmission band in the transmission signal, and propagating the transmission-band component to the transmission-side second terminal; and the reception-side directional propagation circuit includes:

a reception-band circulator; and an out-of-reception-band filter for blocking the reception-band component in the received signal, the reception-band circulator including:

a reception-side first terminal for inputting the received signal from the first reception-side filter and propagating the received signal to a reception-side third terminal;

a reception-side second terminal for outputting, to the second reception-side filter, the reception-band component in the received signal; and a reception-side third terminal for outputting, to one terminal of the out-of-reception-band filter, a component other than that of the reception band in the received signal, and propagating the reception-band component to the reception-side second terminal.

2. The duplexer according to claim 1, further comprising:

a first high frequency terminator connected to the other terminal of the out-of-transmission-band filter and terminated; and a second high frequency terminator connected to the other terminal of the out-of-reception-band filter and terminated.

3. The duplexer according to claim 2, further comprising:

a high frequency amplifier connected between the transmission-side terminal and the first transmission-side filter;

a transmission line connected between the high frequency amplifier and the first transmission-side filter; and a printed circuit board with the transmission line formed thereon, wherein the high frequency amplifier, the transmission-side circuit unit, the first high frequency terminator, the reception-side circuit unit, and the second high frequency terminator are mounted on the printed circuit board.

4. The duplexer according to claim 1, further comprising a high frequency attenuator connected between the other terminal of the out-of-transmission-band filter and the other terminal of the out-of-reception-band filter.

5. The duplexer according to claim 4, further comprising:

a high frequency amplifier connected between the transmission-side terminal and the first transmission-side filter;

a transmission line connected between the high frequency amplifier and the first transmission-side filter; and a printed circuit board with the transmission line formed thereon, wherein the high frequency amplifier, the transmission-side circuit unit, the reception-side circuit unit, and the high frequency attenuator are mounted on the printed circuit board.

* * * * *